United States Patent
Kikuchi et al.

(10) Patent No.: US 12,410,509 B2
(45) Date of Patent: Sep. 9, 2025

(54) COPPER-COATED ALUMINUM WIRE MATERIAL AND PRODUCTION METHOD THEREFOR

(71) Applicant: NATIONAL INSTITUTE FOR MATERIALS SCIENCE, Tsukuba (JP)

(72) Inventors: Akihiro Kikuchi, Tsukuba (JP); Hitoshi Kitaguchi, Tsukuba (JP); Yasuo Iijima, Tsukuba (JP); Kazuto Hirata, Tsukuba (JP)

(73) Assignee: NATIONAL INSTITUTE FOR MATERIALS SCIENCE, Ibaraki (JP)

( * ) Notice: Subject to any disclaimer, the term of this patent is extended or adjusted under 35 U.S.C. 154(b) by 0 days.

(21) Appl. No.: 18/275,775

(22) PCT Filed: Feb. 28, 2022

(86) PCT No.: PCT/JP2022/008429
§ 371 (c)(1),
(2) Date: Aug. 3, 2023

(87) PCT Pub. No.: WO2022/190942
PCT Pub. Date: Sep. 15, 2022

(65) Prior Publication Data
US 2024/0117483 A1    Apr. 11, 2024

(30) Foreign Application Priority Data
Mar. 12, 2021 (JP) .................. 2021-040009

(51) Int. Cl.
*C23C 14/16* (2006.01)
*B21C 37/04* (2006.01)
(Continued)

(52) U.S. Cl.
CPC ............ *C23C 14/16* (2013.01); *B21C 37/042* (2013.01); *B32B 1/00* (2013.01); *B32B 15/017* (2013.01);
(Continued)

(58) Field of Classification Search
CPC ........ C23C 14/16; C23C 14/022; C23C 14/30; C23C 14/32; C23C 14/5806;
(Continued)

(56) References Cited

U.S. PATENT DOCUMENTS 5,965,279 A * 10/1999 Yu ............................. C25D 5/44
428/650
10,630,005 B1 * 4/2020 Ridley ...................... H01R 4/20
(Continued)

FOREIGN PATENT DOCUMENTS

| GB | 1207593 | 10/1970 |
|----|---------|---------|
| GB | 1489510 | 10/1977 |

(Continued)

OTHER PUBLICATIONS

International Search Report (with partial translation) issued May 10, 2022, issued in corresponding International Patent Application No. PCT/JP2022/008429.
(Continued)

*Primary Examiner* — Michael E. La Villa
(74) *Attorney, Agent, or Firm* — Morgan, Lewis & Bockius LLP

(57) ABSTRACT

The present disclosure provides a copper-coated aluminum wire material including an aluminum wire material and a copper thin film coating the aluminum wire material that a space factor of the thin copper film is in the range of 0.2% to 4%.

20 Claims, 9 Drawing Sheets

(51) Int. Cl.
  *B32B 1/00* (2006.01)
  *B32B 15/01* (2006.01)
  *B32B 15/04* (2006.01)
  *B32B 15/20* (2006.01)
  *C23C 14/02* (2006.01)
  *C23C 14/30* (2006.01)
  *C23C 14/32* (2006.01)
  *C23C 14/56* (2006.01)
  *C23C 14/58* (2006.01)
  *C23C 16/54* (2006.01)
  *C23C 28/00* (2006.01)
  *C23C 28/02* (2006.01)
  *C23C 30/00* (2006.01)
  *H01B 1/02* (2006.01)
  *B21C 1/04* (2006.01)

(52) U.S. Cl.
  CPC ............ *B32B 15/04* (2013.01); *B32B 15/043* (2013.01); *B32B 15/20* (2013.01); *C23C 14/022* (2013.01); *C23C 14/165* (2013.01); *C23C 14/30* (2013.01); *C23C 14/32* (2013.01); *C23C 14/562* (2013.01); *C23C 14/5806* (2013.01); *C23C 14/5886* (2013.01); *C23C 16/545* (2013.01); *C23C 28/02* (2013.01); *C23C 28/021* (2013.01); *C23C 28/023* (2013.01); *C23C 28/322* (2013.01); *C23C 28/345* (2013.01); *C23C 30/005* (2013.01); *H01B 1/02* (2013.01); *H01B 1/023* (2013.01); *H01B 1/026* (2013.01); *B21C 1/04* (2013.01); *C23C 30/00* (2013.01); *Y10T 428/1275* (2015.01); *Y10T 428/12903* (2015.01)

(58) Field of Classification Search
  CPC . C23C 14/5886; C23C 14/165; C23C 14/562; C23C 16/545; C23C 28/322; C23C 28/345; C23C 28/023; C23C 28/021; C23C 28/02; C23C 30/00; C23C 30/005; H01B 1/02; H01B 1/023; H01B 1/026; B21C 1/04; B21C 37/042; Y10T 428/12903; Y10T 428/1275; B32B 1/00; B32B 15/017; B32B 15/04; B32B 15/043; B32B 15/20
  See application file for complete search history.

(56) References Cited

U.S. PATENT DOCUMENTS

2013/0014973 A1    1/2013  Shinmoto et al.
2021/0164120 A1*   6/2021  Yamauchi .............. H01B 1/023

FOREIGN PATENT DOCUMENTS

| JP | H05-285690 A   | 11/1993 |
| JP | 2000-113730 A  | 4/2000  |
| JP | 2005-248318 A  | 9/2005  |
| JP | 2011-194439 A  | 10/2011 |
| WO | 2019/193960 A1 | 10/2019 |

OTHER PUBLICATIONS

Extended European Search Report issued in European Patent Application No. 22766901.7 dated Apr. 3, 2025.

* cited by examiner

COPPER-COATED ALUMINUM WIRE MATERIAL AND PRODUCTION METHOD THEREFOR

TECHNICAL FIELD

The present invention relates to a copper-coated aluminum wire material and a production method therefor.

BACKGROUND ART

Aluminum is light as its specific gravity is about 30% of the specific gravity of copper, and has high electric conductivity to some extent. Thin pure copper wires are presently used for a wire harness (i.e., a plurality of electric wires used for power supply and signal communication) and the like mounted on a vehicle, but the replacement of the thin pure copper wires with light aluminum wires is desired for fuel efficiency.

However, the practical use of aluminum wires mainly has three problems. First, the strength of the aluminum wires remarkably decreases with the purity to increase the electric conductivity increasing. Second, since the surface of aluminum is coated with a nano-scale strong passive oxide film, soldering is not easy. Third, when aluminum has contact with water such as rainwater together with a metal having a big potential difference, corrosion (i.e., electric corrosion) occurs, and thus it is difficult to use aluminum as a naked wire. In order to overcome these problems, a copper-clad aluminum wire obtained by inserting an aluminum bar into a large-diameter pure copper tube and wire drawing it has been developed and is now commercially available (see, for example, Patent Literature 1).

However, according to Patent Literature 1, in the copper-clad aluminum wire, aluminum is coated with pure copper by means of a plastic processing method securing a high degree of processing. Thus, it is difficult to decrease the space factor of pure copper per the section area of a wire material. As a result, aluminum's advantage of lightness cannot be maximized, and the copper-clad aluminum wire is not widely used.

Also, there is a technique of performing thin pure-copper electroplating on a small-diameter aluminum wire. However, aluminum is an easily oxidized material, and even when a passive oxide coating film on the surface of aluminum is removed by an activation treatment, aluminum generates a coating film, during performing water washing thereafter, due to a slight amount of oxygen dissolved in the water used in the water washing. Such aluminum having a coating film thereon causes an adhesion defect. In order to improve this phenomenon, a zincate treatment in which the activation of the surface of aluminum is performed simultaneously with replacement deposition of a zinc coating film is generally employed as a treatment of an aluminum wire (see, for example, Patent Literature 2). However, the employment of the technique described in Patent Literature 2 requires a huge amount of time for the treatment of a long wire having a length not less than several kilometers, and thus is not realistic.

CITATION LIST

Patent Literature

PATENT LITERATURE 1: JP 2011-194439 A
PATENT LITERATURE 2: JP 2000-113730 A

SUMMARY OF INVENTION

Technical Problem

The problem of the present invention is to provide a copper-coated aluminum wire material which has excellent adhesiveness and is made lighter in weight, and a production method therefor.

Solution to Problem

A copper-coated aluminum wire material according to the present invention comprises: an aluminum wire material made of aluminum or an aluminum alloy; and a copper thin film coating the aluminum wire material, wherein a space factor of the copper thin film is in a range of 0.2% or more to 4% or less, and an adhesiveness between the aluminum wire material and the copper thin film according to a scratch test conforming to JIS R 3255 satisfies 10 mN or more. The problem is thereby solved.

The space factor of the copper thin film may be in a range of 0.2% or more to less than 1%.

The space factor of the copper thin film may be in a range of 0.3% or more to 0.55% or less.

The adhesiveness may satisfy a range of 20 mN or more to 100 mN or less.

The adhesiveness may satisfy a range of 50 mN or more to 100 mN or less.

The aluminum may have a purity in a range of 99.9% or more to 99.99999% or less.

The aluminum alloy may be an alloy of aluminum (Al) with at least one element selected from the group consisting of magnesium (Mg), iron (Fe), zirconium (Zr), zinc (Zn), chromium (Cr), scandium (Sc), manganese (Mn), boron (B), titanium (Ti), copper (Cu), lithium (Li), and silicon (Si).

The copper-coated aluminum wire material need not have a passive oxide coating film in an interface between the aluminum wire material and the copper thin film.

A method according to the present invention, namely, the method for producing a copper-coated aluminum wire material by coating an aluminum wire material made of aluminum or an aluminum alloy with a copper thin film by means of an ion plating method, comprises the following steps of: setting, in a vacuum chamber providing a copper evaporation source, an aluminum wire material having an outer diameter in a range of 0.1 mm or more to 1.5 mm or less and being wound around a first drum, wherein the aluminum wire material from the first drum can be wound up around a second drum by cross-rotating at least one pair of return rolls and a distance between the aluminum wire material straddling the at least one pair of return rolls and a center of the copper evaporation source is from 500 mm or more to 1000 mm or less; evaporating copper from the copper evaporation source by electron-beam heating and ionizing the evaporated copper; applying a negative voltage in a range of more than 10 V to 800 V or less to the first drum and the second drum; and forming the copper thin film on the aluminum wire material by bringing copper ions formed by ionizing the evaporated copper into collision with the aluminum wire material which is, at a speed of 1 m/min or more to less than 15 m/min, wound up around the second drum from the first drum by cross-rotating the at least one pair of return rolls. The above problem is thereby solved.

As for the above step of applying a negative voltage, a negative voltage in a range of 50 V or more to 700 V or less may be applied.

As for the above step of applying a negative voltage, a negative voltage in a range of 200 V or more to 700 V or less may be applied.

As for the above step of forming a copper thin film, the aluminum wire material may be wound up at a speed of 1 m/min or more to 5 m/min or less.

The aluminum may have a purity in a range of 99.9% or more to 99.99999% or less.

The aluminum alloy may be an alloy of aluminum (Al) with at least one element selected from the group consisting of magnesium (Mg), iron (Fe), zirconium (Zr), zinc (Zn), chromium (Cr), scandium (Sc), manganese (Mn), boron (B), titanium (Ti), copper (Cu), lithium (Li), and silicon (Si).

The method may further comprise a step of washing a surface of the aluminum wire material by an ion bombardment treatment using an argon ion, prior to the above step of evaporating copper from the copper evaporation source by electron-beam heating and ionizing the evaporated copper.

The ion bombardment treatment may be performed at a pressure in the vacuum chamber in a range of 1 Pa or more to 10 Pa or less.

The method may further comprise a step of repeating the above step of forming the copper thin film.

The method may further comprise a step of performing a wire drawing treatment of the copper-coated aluminum wire material produced by the above step of forming the copper thin film.

The above step of performing the wire drawing treatment may be a drawing process by means of a carbide die or a diamond die.

The copper-coated aluminum wire material may be annealed in a temperature range of 300° C. or more to 500° C. or less for a time of 1 second or more to 5 minutes or less before, after, or during the drawing process.

Advantageous Effects of Invention

The production method according to the present invention, namely, the method for producing a copper-coated aluminum wire material enables an aluminum wire material made of aluminum or an aluminum alloy to be coated with a copper thin film by means of an ion plating method. In the production method according to the present invention, the copper thin film can be formed while removing a passive oxide coating film on the surface of the aluminum wire material because sufficient collision energy is obtained by, as described above, setting to the prescribed range an area for vapor-depositing copper ions on the aluminum wire material. As a result, the copper-coated aluminum wire material in which adhesiveness between the copper thin film and the aluminum wire material is excellent can be provided.

Also, in the production method according to the present invention, the vapor deposition is performed while cross-rotating is performed by using the at least one pair of return rolls, and thus the surface of the aluminum wire material can be uniformly and thinly coated with the copper thin film. As a result, the copper-coated aluminum wire material which has a small space factor of copper and is made lighter in weight can be provided. Also, by setting the wind-up speed of the aluminum wire material to the above-described prescribed speed, a copper-coated aluminum wire material without causing the breaking of wire and with a good yield even when a long wire thereof is produced. Also, the production method according to the present invention can be applied to high-purity soft aluminum, and thus can improve proof stress of the whole aluminum wire material by coating the aluminum wire material with the copper thin film. Therefore, the production method according to the present invention also enables ultra-thin wire drawing treatment to be performed.

BRIEF DESCRIPTION OF DRAWINGS

FIG. 7(A) shows how the copper-coated aluminum wire material is wound up around a second drum, and FIG. 7(B) shows what the copper-coated aluminum wire material looks like after the wire drawing treatment was performed.

FIG. 8(A) shows a sectional SEM image of the copper-coated aluminum wire material of Example 2, and FIG. 8(B) shows a sectional SEM image of the copper-coated aluminum wire material of Example 5.

DESCRIPTION OF EMBODIMENTS

Hereinafter, embodiments of the present invention are described with reference to the above figures. The same number is assigned to the same element, and the description thereof is omitted.

Figure 1:
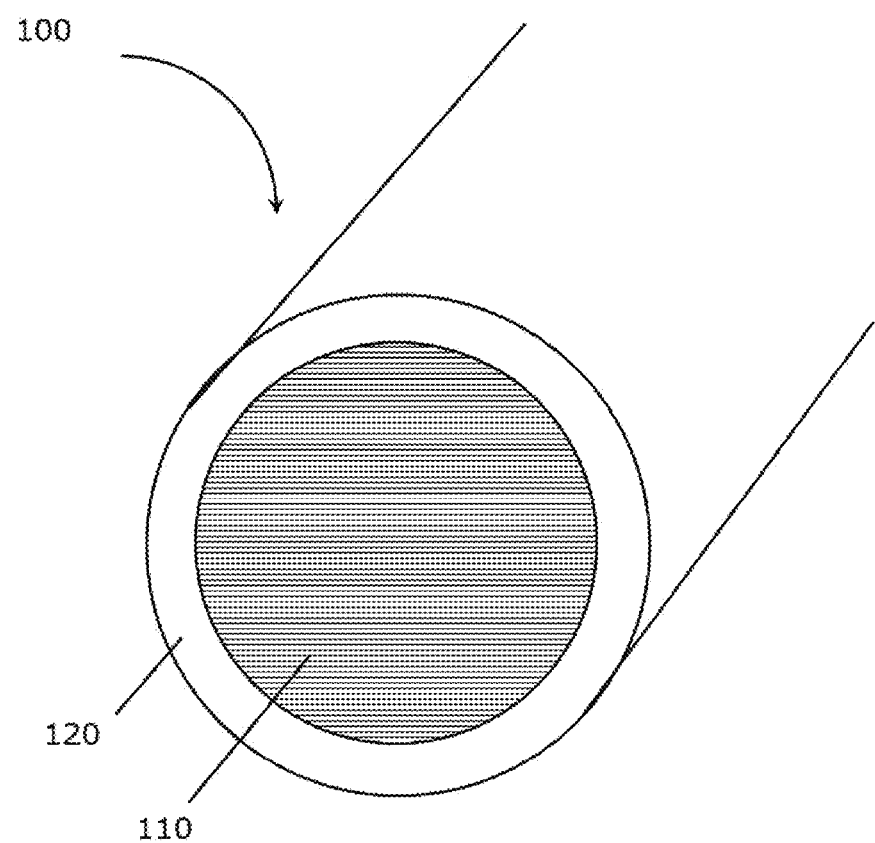
FIG. 1 is a schematic view showing a copper-coated aluminum wire material according to the present invention.

FIG. 1 is a schematic view showing a copper-coated aluminum wire material according to the present invention.

A copper-coated aluminum wire material 100 according to the present invention includes the following: an aluminum wire material 110 made of aluminum or an aluminum alloy; and a copper thin film 120 coating the aluminum wire material 110. The aluminum wire material 110 is coated with the copper thin film 120, and thus the copper-coated aluminum wire material has environment resistance.

In the copper-coated aluminum wire material 100 according to the present invention, the space factor (%) of the copper thin film 120 is 0.2% or more to 4% or less. The copper-coated aluminum wire material thereby enables to be made lighter in weight. The space factor (%) of the copper thin film 120 represents a percentage of sectional area of the copper thin film 120 with regard to the total sectional area of the copper-coated aluminum wire material 100. The space factor (%) of the copper thin film 120 is preferably in a range of 0.2% or more to less than 1%. The copper-coated aluminum wire material thereby enables to be further made lighter in weight. The space factor (%) of the copper thin film 120 is further preferably in a range of 0.3% or more to 0.55% or less. When the space factor (%) is kept in this range, the copper-coated aluminum wire material enables to be made lighter in weight while maintaining adhesiveness. The sectional area means the area of a section along the direction perpendicular to the longitudinal direction of the copper-coated aluminum wire material 100.

Since the copper-coated aluminum wire material 100 according to the present invention includes no passive oxide coating film between the aluminum wire material 110 and the copper thin film 120, the adhesiveness between the aluminum wire material 110 and the copper thin film 120 according to a scratch test conforming to JIS R 3255 satisfies 10 mN or more, and no adhesion defect is caused. Since there is no concern about an adhesion defect when adhesiveness is 10 mN or more, the upper limit of the adhesiveness is not particularly limited but may be 300 mN or less.

The adhesiveness preferably satisfies a range of 20 mN or more to 100 mN or less. When the adhesiveness is kept in this range, in the copper-coated aluminum wire material 100, its adhesiveness is higher and the peeling of the copper thin film 120 does not occur, and proof stress of the copper-coated aluminum wire material 100 more improves. The adhesiveness satisfies more preferably a range of 30 mN or more to 100 mN or less, further more preferably a range of 50 mN or more to 100 mN or less. When the adhesiveness is kept in this range, proof stress of the copper-coated aluminum wire material 100 further improves.

The aluminum wire material 110 has only to be aluminum or an aluminum alloy, and aluminum preferably has a purity in a range of 99.9% or more to 99.99999% or less. The copper-coated aluminum wire material according to the present invention can be used without causing the breaking of wire even when the high-purity aluminum wire material is used.

Apart from pure aluminum, an aluminum alloy can also be used. The aluminum alloy may be an alloy containing, as main components, aluminum (Al) and at least one element selected from the group consisting of magnesium (Mg), iron (Fe), zirconium (Zr), zinc (Zn), chromium (Cr), scandium (Sc), manganese (Mn), boron (B), titanium (Ti), copper (Cu), lithium (Li), and silicon (Si).

The content of the element constituting the aluminum alloy other than aluminum has only to be preferably 0.1 at % or more to 10 at % or less. In this case, at least two elements other than Al may be selected as long as the total content of the elements is within this range. From this viewpoint, the amount of Al as a main component in the aluminum alloy may be 90 at % or more to less than 99.9 at %.

Next, as for the method for producing a copper-coated aluminum wire material 100 according to the present invention, the preferred production method is described.

Figure 2:
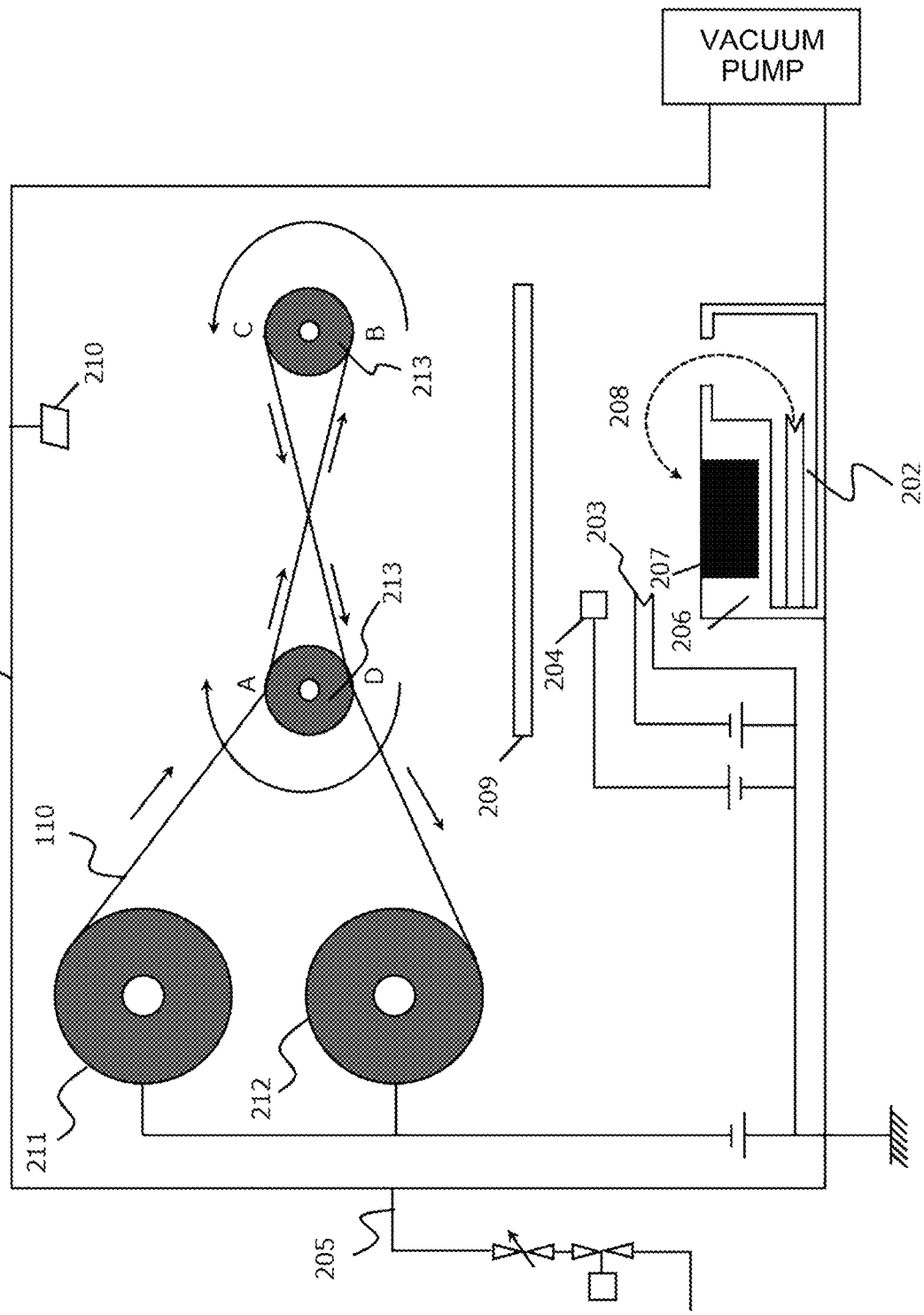
FIG. 2 is a schematic view showing a production device for producing the copper-coated aluminum wire material according to the present invention.

FIG. 2 is a schematic view showing a production device for producing the copper-coated aluminum wire material according to the present invention.

Figure 3:
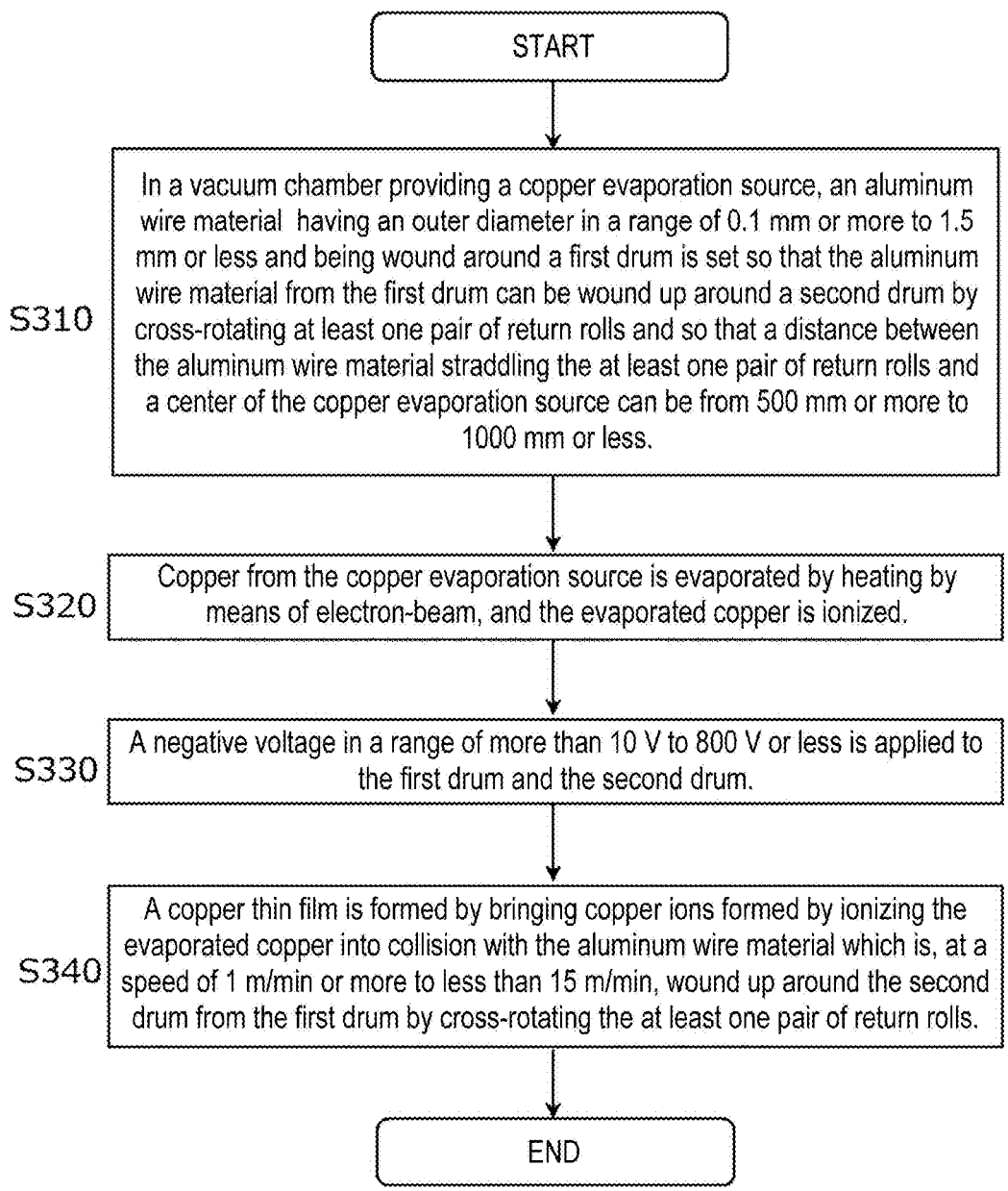
FIG. 3 is a flow chart describing the steps of producing the copper-coated aluminum wire material according to the present invention.

FIG. 3 is a flow chart describing the steps of producing the copper-coated aluminum wire material according to the present invention.

The inventors of the present invention have found that by employing an ion plating method and setting various conditions, the copper thin film can be very thinly formed simultaneously with removal of a passive oxide coating film of the aluminum wire material.

In the method according to the present invention, an ion plating device shown in FIG. 2 is employed, but it is to be noted that the configuration shown in FIG. 2 is one example and the device is not limited to this configuration. In this case, an ion plating device 200 that includes a vacuum chamber 201, an electron gun 202 provided in the vacuum chamber 201, a thermionic filament 203, and an ionization electrode 204 can be employed.

The vacuum chamber 201 can be vacuumed via an outlet by a vacuum pump of a diffusion pump, a turbo-molecular pump, a cryopump, or the like. The vacuum chamber 201 is, via a gas supply tube 205, supplied with a reactive gas, a discharge cleaning gas (specifically, ion bombard treatment gas), or the like.

The electron gun 202 heats and evaporates an evaporation source (here, a copper metal) 207 housed in a hearth liner 206. The electron gun 202 generates an electron beam 208 by power supply from an electron gun power supply device (not shown in the figure) provided outside the vacuum chamber 201. The electron beam 208 is deflected and applied to the evaporation source or in the hearth liner 206. The evaporation source 207 is heated and evaporated.

The thermionic filament 203 is connected to a filament heating power supply device (not shown in the figure) and supplied with alternating-current power. The thermionic filament 203 is heated by power supply and thermionic electrons thereof are discharged. The thermionic filament 203 described above is made of a metal of tungsten, molybdenum, tantalum, or the like.

The ionization electrode 204 is configured so that a positive voltage can be applied thereto. While the thermionic electrons discharged from the thermionic filament 203 go toward the ionization electrode 204, they collide with evaporated particles (here, copper particles), namely, particles evaporated from the evaporation source 207 to thereby ionize the evaporated particles. The ionized particles (here, copper ions) formed by ionizing the evaporated particles attach to an object, and thus a thin film thereof is formed. As shown in FIG. 2, a shutter 209 may be provided so that the timing of attachment of the ionized particles formed by ionizing the evaporated particles to the object can be controlled. In addition, a film thickness meter 210 may also be provided that the thickness of the formed thin film can be measured. The ion plating device 200 described above may be the same as an already-existing ion plating device.

The ion plating device 200 further houses a first drum 211 and a second drum 212. The aluminum wire material 110 made of aluminum or an aluminum alloy is wound around the first drum 211, and the ion plating device is configured so that the second drum 212 can wind up the aluminum wire material from the first drum 211 therearound. In addition, the first drum 211 and the second drum 212 are configured so that a voltage can be applied thereto, and the aluminum wire material 110 thereby comes to be the object in the ion plating device 200.

Figure 4:
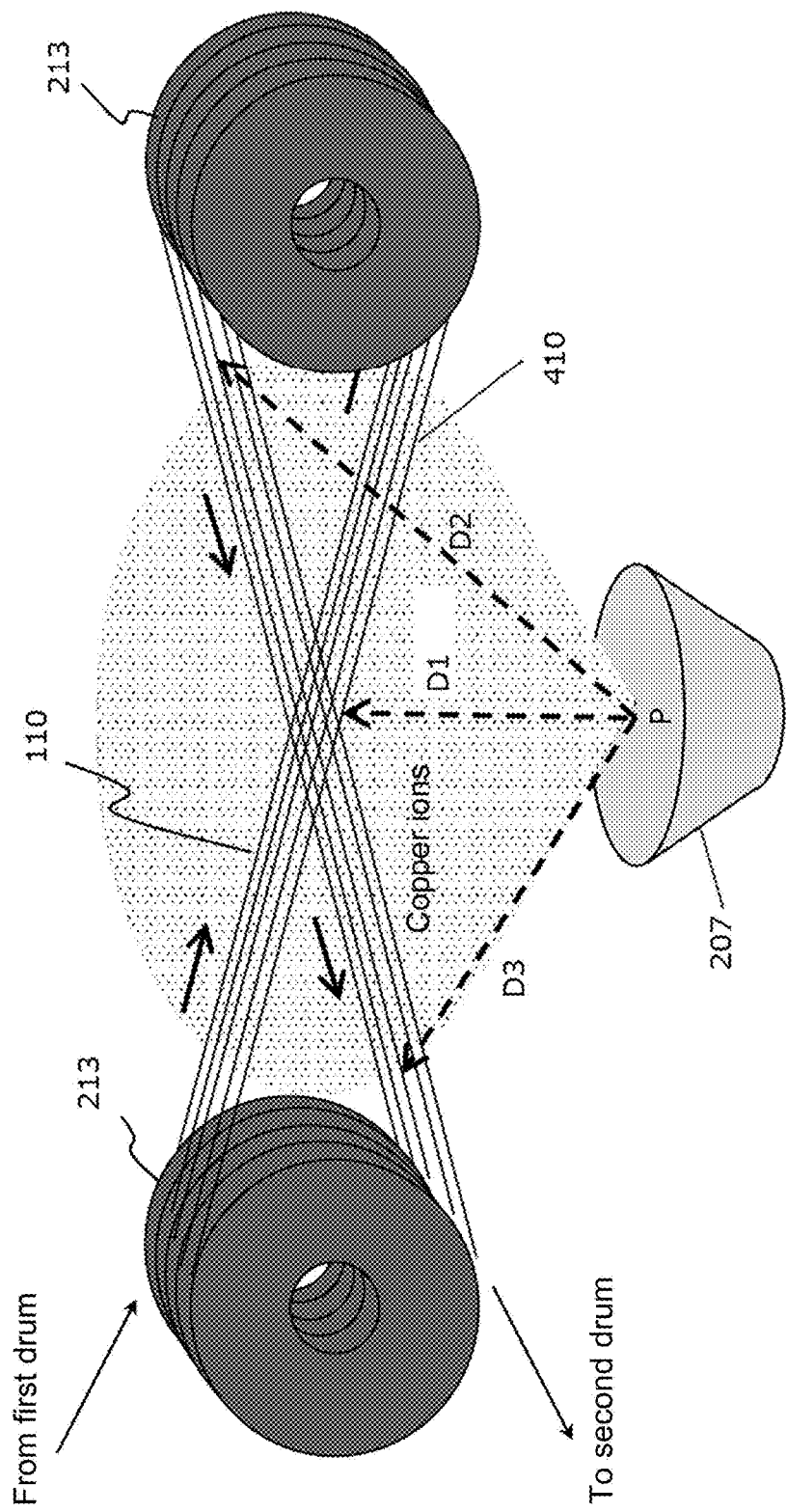
FIG. 4 is a view schematically showing a vapor deposition area in an ion plating device.

The ion plating device 200 further houses at least one pair (i.e., one set) of return rolls 213 so that the aluminum wire material 110 sent out from the first drum 211 can be wound up around the second drum 212 by cross-rotating the at least one pair of return rolls. In the case where the number of a pair of the return rolls is one, for example, the copper thin film is formed on one surface of the aluminum wire material while the aluminum wire material moves from "A" to "B", and the copper thin film is formed on the other surface while the aluminum wire material moves from "C" to "D". By providing two or more pair of the return rolls, the thickness of the copper thin film coating the aluminum wire material can be more efficiently controlled. When being specifically explained according to FIG. 2, a combination of one return roll 213 moving the aluminum wire material from "A" to "B" and one return roll 213 moving the aluminum wire material from "C" to "D" is referred to as "one pair (i.e., one set) of return rolls 213". Thus, the case where the number of the above combination is five as shown in FIG. 4 is referred to as "five pairs (i.e., five sets) of the return rolls 213" is provided.

FIG. 2 illustrates the ion plating device 200 having a configuration in which the aluminum wire material from the first drum 211 is wound up around the second drum 212 via at least one pair of the return rolls 213. However, the ion plating device may have a configuration in which the aluminum wire material from the second drum 212 is wound up around the first drum 211 via at least one pair of the return rolls 213. By using the ion plating device 200 described above, each step of the method according to the present invention is described.

Step S310: In this step, in a vacuum chamber 201 providing a copper evaporation source 207, the aluminum wire material 110 having an outer diameter in a range of 0.1 mm or more to 1.5 mm or less and being wound around the first drum 211 is set so that the aluminum wire material 110 from the first drum 211 can be wound up around the second drum 212 by cross-rotating at least one pair of the return rolls 213 (for example, in the following order: A→B→C→D) and so that a distance between the aluminum wire material 110 straddling the at least one pair of the return rolls 213 and a center of the copper evaporation source 207 can be from 500 mm or more to 1000 mm or less. The aluminum wire material 110 is the same aluminum wire material explained with reference to FIG. 1, and the explanation thereof is omitted. A configuration providing two pairs (i.e., two sets) or more of the return rolls is advantageous to control the thickness of the copper thin film coating the aluminum wire material because the number of times of cross rotations is increased.

In the step S310, when the aluminum wire material 110 is set, the interior of the vacuum chamber 201 is vacuumed. The degree of vacuum at this time is preferably in a range of $1 \times 10^{-9}$ Pa or more to $1 \times 10^{-5}$ Pa or less, more preferably in a range of $1 \times 10^{-7}$ Pa or more to $1 \times 10^{-5}$ Pa or less.

FIG. 4 is a view schematically showing a vapor deposition area in the ion plating device.

Figure 5:
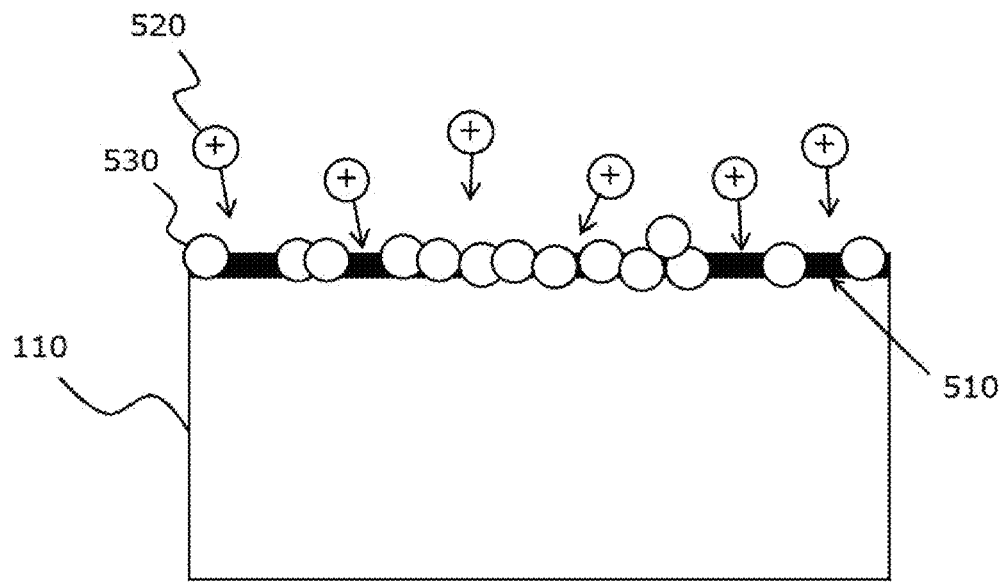
FIG. 5 is a schematic view showing how coating with a copper thin film is performed by means of an ion plating method.

FIG. 5 is a schematic view showing how coating with the copper thin film is performed by means of an ion plating method.

FIG. 4 shows an enlarged vapor deposition area in the ion plating device providing five sets of the return rolls 213. A vapor deposition area 410 obtained by evaporation of the evaporation source 207 is represented by hatching. Focusing on the vapor deposition area 410 that can be formed in a step S320 described later, there are three lengths, namely, a distance "D1", a distance "D2", and a distance "D3" between a center P of the evaporation source 207 and the aluminum wire material 110 straddling the return rolls 213. Here, the distance "D1" is the shortest distance, and the distance "D2" is the longest distance. Each of the distance "D1", the distance "D2", and the distance "D3" satisfies a range of 500 mm to 1000 mm, and further their distance relationships satisfy "D1<D3<D2". The inventors of the present application have found that by limiting the vapor deposition area 410 as described above, the copper thin film made from copper particles 530 is formed simultaneously with removal of a passive oxide coating film 510 on the surface of the aluminum wire material 110 due to collision energy generated by collision of copper ions 520 with the aluminum wire material 110. From this result, it has been confirmed that the method enables high adhesiveness between the copper thin film and the aluminum wire material.

Step S320: In this step, copper from the copper evaporation source 207 is evaporated by heating by means of electron-beam 208, and the evaporated copper is ionized. The evaporation of the copper from the copper evaporation source 207 and the ionization of the evaporated copper are performed by the electron gun 202, the thermionic filament 203, and the ionization electrode 204 of the ion plating device 200.

In the step S320, the degree of vacuum is preferably set to a range of $1 \times 10^{-4}$ Pa or more to $1 \times 10^{-2}$ Pa or less. Since the amount of evaporated copper is thereby controlled and many copper particles are ionized, the formation of the copper thin film is further efficiently promoted.

Step S330: In this step, a negative voltage in a range of more than 10 V to 800 V or less is applied to the first drum 211 and the second drum 212. Positively charged copper ions ionized in the step S320 can thereby be attached to the aluminum wire material 110 to which negative voltage is applied. The negative voltage to be applied is preferably in a range of 50 V or more to 700 V or less. The copper ions are thereby more efficiently attached to the aluminum wire material 110. The negative voltage to be applied is more preferably in a range of 200 V or more to 700 V or less. The copper ions are thereby further more efficiently attached to the aluminum wire material 110.

Step S340: In this step, a copper thin film is formed by bringing copper ions formed by ionizing the evaporated copper into collision with the aluminum wire material 110 which is, at a speed of 1 m/min or more to less than 15 m/min, wound up around the second drum 212 from the first drum 211 by cross-rotating the at least one pair of the return rolls 213. The copper thin film is thereby formed on the surface of the aluminum wire material 110 while a passive oxide coating film on the surface is destroyed and removed. As a result, a copper-coated aluminum wire material 100 (see FIG. 1) can be obtained. When the wind-up speed is lower than 1 m/min, the temperature of the aluminum wire material is increased by the collision of the copper ions, and thus there may happen the breaking of the aluminum wire material during the ion plating treatment. When the wind-up speed is 15 m/min or more, the aluminum wire material may generate an area not coated with copper.

The aluminum wire material 110 is wound up preferably at a speed of 1 m/min or more to 5 m/min or less. The copper-coated aluminum wire material from which a passive oxide coating film is removed can thereby be efficiently obtained. The aluminum wire material 110 is wound up more preferably at a speed of 2 m/min to 5 m/min. The copper-coated aluminum wire material including no passive oxide coating film can thereby be further efficiently obtained.

The formation of a copper thin film in the step 340 may be repeated. For example, after the aluminum wire material 110 from the first drum 211 was wound up around the second drum 212, the step 340 may be performed again by exchanging the first drum 211 around which the aluminum wire material 110 was wound up for the second drum 212 which wound up the aluminum wire material 110 as well as exchanging the second drum 212 which wound up the aluminum wire material 110 for the first drum 211 around which the aluminum wire material 110 was wound up. As a result, the thickness of the copper thin film coating the aluminum wire material can be controlled. Also, after the aluminum wire material 110 from the first drum 211 was wound up around the second drum 212 as the copper-coated aluminum wire material 100, the step 340 may be performed in the reverse direction (, for example, in the order of "D→C→B→A" in FIG. 4) so that the copper-coated aluminum wire material 100 from the second drum 212 can be wound up around the first drum 211 by cross-rotating the at least one pair of the return rolls 213. Also, after the wind-up process performing in such a reverse direction was completed, the step 340 may be performed again in the forward direction (, for example, in the order of "A→B→C→D" in FIG. 4). Such a modification is within the scope of the present description. As described above, by appropriately combining the repeating times of the wind-up process in the step 340 and/or the number of a pair of the return rolls 213 in the step S310, the aluminum wire material 110 can further efficiently be coated with the copper thin film having a thickness according to its uses.

The steps S320, S330, and S340 may be performed simultaneously, or may be performed in the order of the step S340, followed by the steps S320, and S330.

After performing the step S310, the surface of the aluminum wire material 110 may be washed by an ion bombardment treatment using an argon ion, prior to the step S320. In this case, the aluminum wire material 110 may be wound up around the second drum 212 from the first drum 211 by cross-rotating the at least one pair of the return rolls 213 in the state of the application of a negative voltage to the first drum 211 and the second drum 212, while performing the ion bombardment treatment. The surface of the aluminum wire material 110 can thereby be washed.

In the ion bombardment treatment, the degree of vacuum is preferably set to a range of 1 Pa or more to 10 Pa or less. The generation of argon plasma is thereby further efficiently promoted. After performing the ion bombardment treatment, the step S320 may be implemented after the degree of vacuum is set again to a range of $1 \times 10^{-9}$ Pa or more to $1 \times 10^{-5}$ Pa or less, more preferably a range of $1 \times 10^{-7}$ Pa or more to $1 \times 10^{-5}$ Pa or less. The wind-up speed is not particularly limited, but may be, for example, 5 m/min or more to 15 m/min.

In the ion bombardment treatment, preferably, a negative voltage in a range of 100 V to 400 V may be applied to the first drum 211 and the second drum 212. As a result, the washing by argon plasma is further efficiently promoted.

Figure 6:
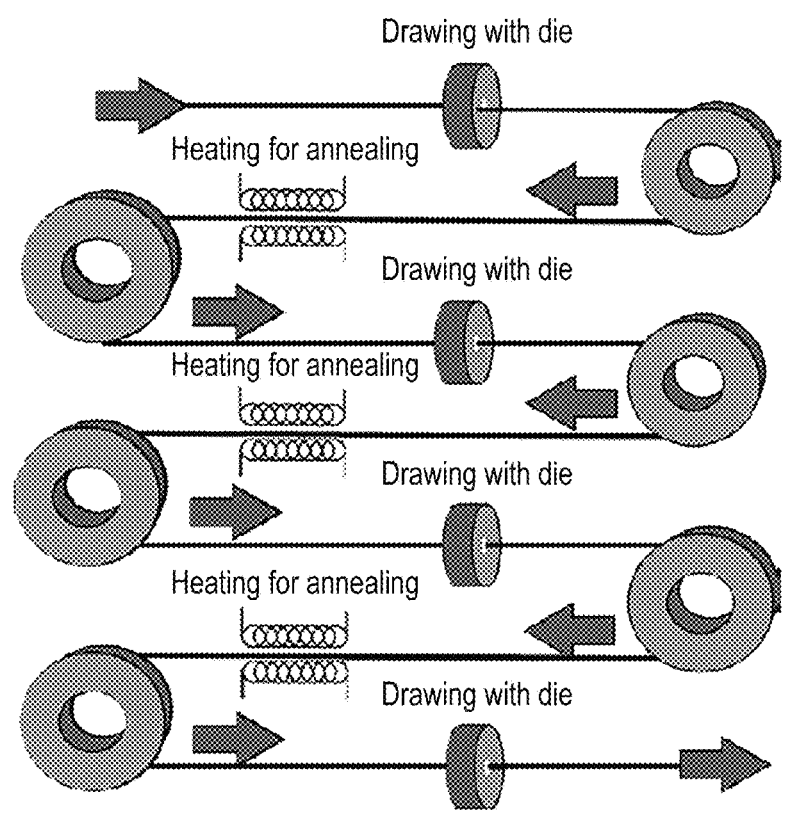
FIG. 6 is a view schematically showing the wire drawing treatment.

FIG. 6 is a view schematically showing the wire drawing treatment.

The copper-coated aluminum wire material 100 can be obtained by the step S340. For the obtained copper-coated aluminum wire material 100 wire, the wire drawing treatment may be further performed. Since the method according to the present invention enables the aluminum wire material 110 having high-purity and softness to be coated with the copper thin film, the proof stress of the whole of the copper-coated aluminum wire material 100 obtained thereby increases. Therefore, the high-pure aluminum wire material 110 can be formed into an ultra-thin wire by performing the wire drawing treatment. Such a wire drawing treatment is not particularly limited, but is preferably a drawing process by means of a carbide die or a diamond die as shown in FIG. 6. The aluminum wire material 110 having an outer diameter in a range of 0.1 mm or more to 1.5 mm or less can thereby be formed into an ultra-thin wire having an outer diameter in a range of 0.05 mm or more to less than 0.1 mm.

The copper-coated aluminum wire material 100 may be annealed in a temperature range of 300° C. or more to 500° C. or less for a time of 1 second or more to 5 minutes or less before, after, or during the drawing process. Since the distortion generated during the drawing process is thereby removed, breakage and a micro crack of the aluminum wire material 110 can further efficiently be suppressed. As shown in FIG. 6, the drawing process and the annealing may be performed two or more times until the copper-coated aluminum wire material has a desired outer diameter.

Next, the present invention is described in detail by way of specific examples, but it is to be noted that the present invention is not limited to these examples.

EXAMPLES

Examples 1 to 24

In each of Examples 1 to 24, a copper-coated aluminum wire material was produced by coating with a copper thin film an aluminum wire material 110 (see FIG. 1) made of aluminum or an aluminum alloy, shown in Table 1, by using an ion plating device 200 (see FIG. 2) providing five sets of return rolls 213 (see FIG. 4) and housing a copper evaporation source 207 (see FIG. 2) (in which purity of copper is 99.999%).

In a vacuum chamber 201 (FIG. 2), the aluminum wire material was set so that distances "D1", "D2", and "D3" were able to be respectively 500 mm, 1000 mm, and 700 mm as shown in FIG. 4 (step S310 in FIG. 3). Here, this setting has the following configuration: aluminum wire material (see FIG. 1) is wound around a first drum 211 (FIG. 2), and the aluminum wire material from the first drum 211 is wound up around a second drum 212 (FIG. 2) in a manner that the five sets of the return rolls 213 is cross-rotated 10 times; and the distance between the aluminum wire material 110 straddling the five sets of the return rolls 213 and a center "P" of the copper evaporation source 207 satisfies a range of 500 mm to 1000 mm. Next, the vacuum chamber 201 was vacuumed by a vacuum pump so as to be the degree of vacuum of $1 \times 10^{-6}$ Pa in the vacuum chamber.

Next, the aluminum wire material was washed by an argon ion bombardment treatment in some examples as shown in Table 1. In detail, an argon gas was introduced into the vacuum chamber 201 and the pressure was set to a range of 1 Pa or more to 10 Pa or less. A negative voltage of 240 V was applied to the first drum 211 and the second drum 212, and argon plasma was generated. Next, the aluminum wire material from the first drum 211 was wound up (i.e., rewound) around the second drum 212 via the five sets of the return rolls. The rewinding speed of the aluminum wire material at this time was set to 10 m/min.

After the argon ion bombardment treatment was completed, the application of a voltage was stopped and the vacuum chamber 201 was vacuumed until the degree of vacuum was $1 \times 10^{-6}$ Pa. Next, the aluminum wire material from the second drum 212 was wound up around the first drum 211 again.

Next, evaporation of the copper evaporation source 207 was performed by heating with an electron beam 208, and then the ionization of the evaporated copper was performed (see step S320 in FIG. 3). In detail, a thermionic voltage was 14 V, a thermionic current was 80 A, an emission current was 450 mA, an ionization voltage was 50 V, and an ionization current was 90 A, and the degree of vacuum in the vacuum chamber 201 was set to 1×10⁻³ Pa. In such a manner, the amount of the evaporated copper was controlled.

Next, a negative voltage at the value shown in Table 1 was applied to the first drum 211 and the second collision drum 212 (see step S330 in FIG. 3). A copper thin film was formed by bringing copper ions of the ionized copper into collision with the aluminum wire material 110 which was, at the speed shown in Table 1, wound up around the second drum 212 from the first drum 211 while the five sets of the return rolls 213 was cross-rotated 10 times (see step S340 in FIG. 3).

Next, the formation of a copper thin film was repeated in some examples as shown in Table 1. In Table 1, the case where the number of the repeated times is 0 means that the formation of a copper thin film (see step S340 in FIG. 3) was performed once, and the case where the number of the repeated times is 1 means that the formation of a copper thin film was performed twice.

In detail, the repetition of the formation of a copper thin film was performed as follows. After the first formation of a copper thin film was completed, the electron-beam heating and the application of a voltage to the first drum 211 and the second drum 212 were stopped and the interior of the vacuum chamber 201 was vacuumed up to a degree of vacuum of 1×10⁻⁶ Pa. Next, the aluminum wire material from the second drum 212 was again wound up around the first drum 211, and the formation of a copper thin film according to the above repetition was performed by again performing the electron-beam heating and the application of the negative voltage under the above-described conditions while the aluminum wire material which was again wound up was performed at the speed shown in Table 1.

Next, the wire drawing treatment was performed in some examples as shown in Table 1. As shown in FIG. 6, the wire drawing treatment was a drawing process in which a diamond die was used a plurality of times. After the drawing process was performed, annealing was performed at 300° C. for 30 seconds.

The copper-coated aluminum wire materials of Examples 1 to 24 produced as described above were observed for each appearance and sections thereof. In the observation of the section, a scanning electron microscope (manufactured by Hitachi High-Tech Corporation, TM3030Plus) or an optical microscope (manufactured by NIKON CORPORATION, ECLIPSE LV150) was used. The thickness of the copper thin film and the space factor of copper were obtained from its SEM image. The adhesiveness between the copper thin film and the aluminum wire material was evaluated according to a scratch test conforming to JIS R 3255. FIGS. 7 to 10 and Table 2 show these results.

TABLE 1

LIST OF EXPERIMENT CONDITIONS FOR COPPER-COATED ALUMINUM WIRE MATERIALS OF EXAMPLES 1 TO 24

| EX-AMPLE | PROPERTIES OF ALUMINUM WIRE MATERIAL | | | DISTANCE FROM COPPER EVAPORATION SOURCE (mm) | | | NUMBER OF PAIR OF RETURN ROLLS | CONDITIONS OF ION PLATING TREATMENT | | | | NUMBER OF REPEATED TIMES | DRAWING PROCESS |
|---|---|---|---|---|---|---|---|---|---|---|---|---|---|
| | TYPE | OUTER DIAMETER (mm) | LENGTH (m) | DRAWING RATIO (%) | | | | SUBSTRATE VOLTAGE (V) | SUBSTRATE CURRENT (A) | WIND-UP SPEED (m/min) | Ar ION BOMBARDMENT | | |
| | | | | | D1 | D2 | D3 | | | | | | | |
| 1 | PURE AL (5N) | 1.5 | 100 | 1.4 | 500 | 1000 | 700 | 5 | 700 | 1.2 | 1.0 | — | 0 | — |
| 2 | PURE AL (4N) | 1.0 | 100 | 1.4 | 500 | 1000 | 700 | 5 | 220 | 1.2 | 2.0 | PERFORMED | 1 | PERFORMED |
| 3 | PURE AL (4N) | 0.8 | 100 | 1.4 | 500 | 1000 | 700 | 5 | 240 | 1.2 | 2.0 | — | 0 | — |
| 4 | PURE AL (3N) | 0.7 | 100 | 1.4 | 500 | 1000 | 700 | 5 | 500 | 1.2 | 0.2 | — | 0 | — |
| 5 | PURE AL (4N) | 0.7 | 100 | 1.4 | 500 | 1000 | 700 | 5 | 5 | 1.2 | 4.0 | PERFORMED | 1 | — |
| 6 | PURE AL (3N) | 0.6 | 100 | 1.4 | 500 | 1000 | 700 | 5 | 100 | 1.2 | 2.0 | — | 1 | — |
| 7 | Al-1.2 at % Mg-0.1 at % Fe | 0.6 | 100 | 1.4 | 500 | 1000 | 700 | 5 | 200 | 1.2 | 1.0 | PERFORMED | 1 | — |
| 8 | PURE AL (4N) | 0.5 | 100 | 1.4 | 500 | 1000 | 700 | 5 | 800 | 1.2 | 0.5 | PERFORMED | 0 | — |
| 9 | Al-0.2 at % Fe | 0.5 | 100 | 1.4 | 500 | 1000 | 700 | 5 | 30 | 1.2 | 2.0 | PERFORMED | 1 | — |
| 10 | Al-1.0 at % Mg-0.5 at % Si | 0.5 | 100 | 1.4 | 500 | 1000 | 700 | 5 | 200 | 1.2 | 5.0 | — | 1 | — |
| 11 | Al-1.0 at % Mg | 0.5 | 100 | 1.4 | 500 | 1000 | 700 | 5 | 10 | 1.2 | 10.0 | — | 1 | — |
| 12 | PURE AL (3N) | 0.4 | 100 | 1.4 | 500 | 1000 | 700 | 5 | 200 | 1.2 | 2.0 | PERFORMED | 1 | — |
| 13 | Al-0.2 at % Mg | 0.2 | 100 | 1.4 | 500 | 1000 | 700 | 5 | 150 | 1.2 | 15.0 | — | 0 | — |
| 14 | Al-1.0 at % Mg | 0.1 | 100 | 1.4 | 500 | 1000 | 700 | 5 | 50 | 1.2 | 2.0 | — | 1 | — |
| 15 | Al-1.2 at % Mg-0.1 at % Fe | 0.1 | 100 | 1.4 | 500 | 1000 | 700 | 5 | 0 | 1.2 | 1.0 | — | 0 | PERFORMED |
| 16 | Al-1.0 at % Mg | 0.2 | 100 | 1.4 | 500 | 1000 | 700 | 5 | 50 | 1.2 | 2.0 | — | 0 | PERFORMED |
| 17 | Al-1.0 at % Mg | 0.3 | 100 | 1.4 | 500 | 1000 | 700 | 5 | 50 | 1.2 | 2.0 | — | 0 | PERFORMED |
| 18 | Al-1.0 at % Mg | 0.4 | 100 | 1.4 | 500 | 1000 | 700 | 5 | 50 | 1.2 | 2.0 | — | 0 | PERFORMED |
| 19 | Al-1.0 at % Mg | 0.5 | 100 | 1.4 | 500 | 1000 | 700 | 5 | 50 | 1.2 | 2.0 | — | 0 | PERFORMED |
| 20 | Al-1.0 at % Mg | 0.6 | 100 | 1.4 | 500 | 1000 | 700 | 5 | 50 | 1.2 | 2.0 | — | 0 | PERFORMED |

TABLE 1-continued

LIST OF EXPERIMENT CONDITIONS FOR COPPER-COATED ALUMINUM WIRE MATERIALS OF EXAMPLES 1 TO 24

| | PROPERTIES OF ALUMINUM WIRE MATERIAL | | | | DISTANCE FROM COPPER EVAPORATION SOURCE (mm) | | | NUMBER OF PAIR OF RETURN ROLLS | CONDITIONS OF ION PLATING TREATMENT | | | | | |
|---|---|---|---|---|---|---|---|---|---|---|---|---|---|---|
| EXAMPLE | TYPE | OUTER DIAMETER (mm) | LENGTH (m) | DRAWING RATIO (%) | D1 | D2 | D3 | | SUBSTRATE VOLTAGE (V) | SUBSTRATE CURRENT (A) | WIND-UP SPEED (m/min) | Ar ION BOMBARDMENT | NUMBER OF REPEATED TIMES | DRAWING PROCESS |
| 21 | Al-1.0 at % Mg | 0.7 | 100 | 1.4 | 500 | 1000 | 700 | 5 | 50 | 1.2 | 2.0 | — | 0 | PERFORMED |
| 22 | Al-1.0 at % Mg | 0.8 | 100 | 1.4 | 500 | 1000 | 700 | 5 | 50 | 1.2 | 2.0 | — | 0 | PERFORMED |
| 23 | Al-1.0 at % Mg | 0.9 | 100 | 1.4 | 500 | 1000 | 700 | 5 | 50 | 1.2 | 2.0 | — | 0 | PERFORMED |
| 24 | Al-1.0 at % Mg | 1.0 | 100 | 1.4 | 500 | 1000 | 700 | 5 | 50 | 1.2 | 2.0 | — | 0 | PERFORMED |

TABLE 2

LIST OF PROPERTIES OF COPPER-COATED ALUMINUM WIRE MATERIALS OF EXAMPLES 1 TO 24

| | FIRST ION-PLATING TREATMENT | | SECOND ION-PLATING TREATMENT | | | |
|---|---|---|---|---|---|---|
| EXAMPLE | THICKNESS OF COPPER THIN FILM (mm) | SPACE FACTOR OF COPPER (%) | THICKNESS OF COPPER THIN FILM (mm) | SPACE FACTOR OF COPPER (%) | CONFIRMATION OF BREAKING OF WIRE TIMES | ADHESIVENESS |
| 1 | 0.0020 | 0.53 | — | — | 0 | ◎ |
| 2 | 0.0010 | 0.40 | 0.0020 | 0.7952 | 0 | ◎ |
| 3 | 0.0010 | 0.50 | — | — | 0 | ◎ |
| 4 | 0.0100 | 5.48 | — | — | 6 | ○ |
| 5 | 0.0005 | 0.29 | 0.0010 | 0.5690 | 0 | X |
| 6 | 0.0010 | 0.66 | 0.0020 | 1.3201 | 0 | ○ |
| 7 | 0.0020 | 1.32 | 0.0040 | 2.6143 | 0 | ○ |
| 8 | 0.0040 | 3.12 | — | — | 2 | ○ |
| 9 | 0.0010 | 0.80 | 0.0020 | 1.5810 | 0 | Δ |
| 10 | 0.0004 | 0.32 | 0.0008 | 0.6369 | 0 | ◎ |
| 11 | 0.0002 | 0.16 | 0.0004 | 0.3192 | 0 | X |
| 12 | 0.0010 | 0.99 | 0.0020 | 1.9704 | 0 | ◎ |
| 13 | 0.0001 | 0.27 | — | — | 1 | ○ |
| 14 | 0.0010 | 3.88 | 0.0020 | 7.5444 | 0 | Δ |
| 15 | 0.0002 | 14.27 | — | — | 8 | X |
| 16 | 0.0040 | 3.88 | — | — | 0 | Δ |
| 17 | 0.0060 | 3.88 | — | — | 0 | Δ |
| 18 | 0.0080 | 3.88 | — | — | 0 | Δ |
| 19 | 0.0100 | 3.88 | — | — | 0 | Δ |
| 20 | 0.0120 | 3.88 | — | — | 0 | Δ |
| 21 | 0.0140 | 3.88 | — | — | 0 | Δ |
| 22 | 0.0160 | 3.88 | — | — | 0 | Δ |
| 23 | 0.0800 | 3.88 | — | — | 0 | Δ |
| 24 | 0.0200 | 3.88 | — | — | 0 | Δ |

X: ADHESIVE FORCE OF LESS THAN 10 mN
Δ: ADHESIVE FORCE OF 20 mN OR MORE TO LESS THAN 30 mN
○: ADHESIVE FORCE OF 30 mN OR MORE TO LESS THAN 50 mN
◎: ADHESIVE FORCE OF 50 mN OR MORE TO 100 mN OR LESS

Figure 7:
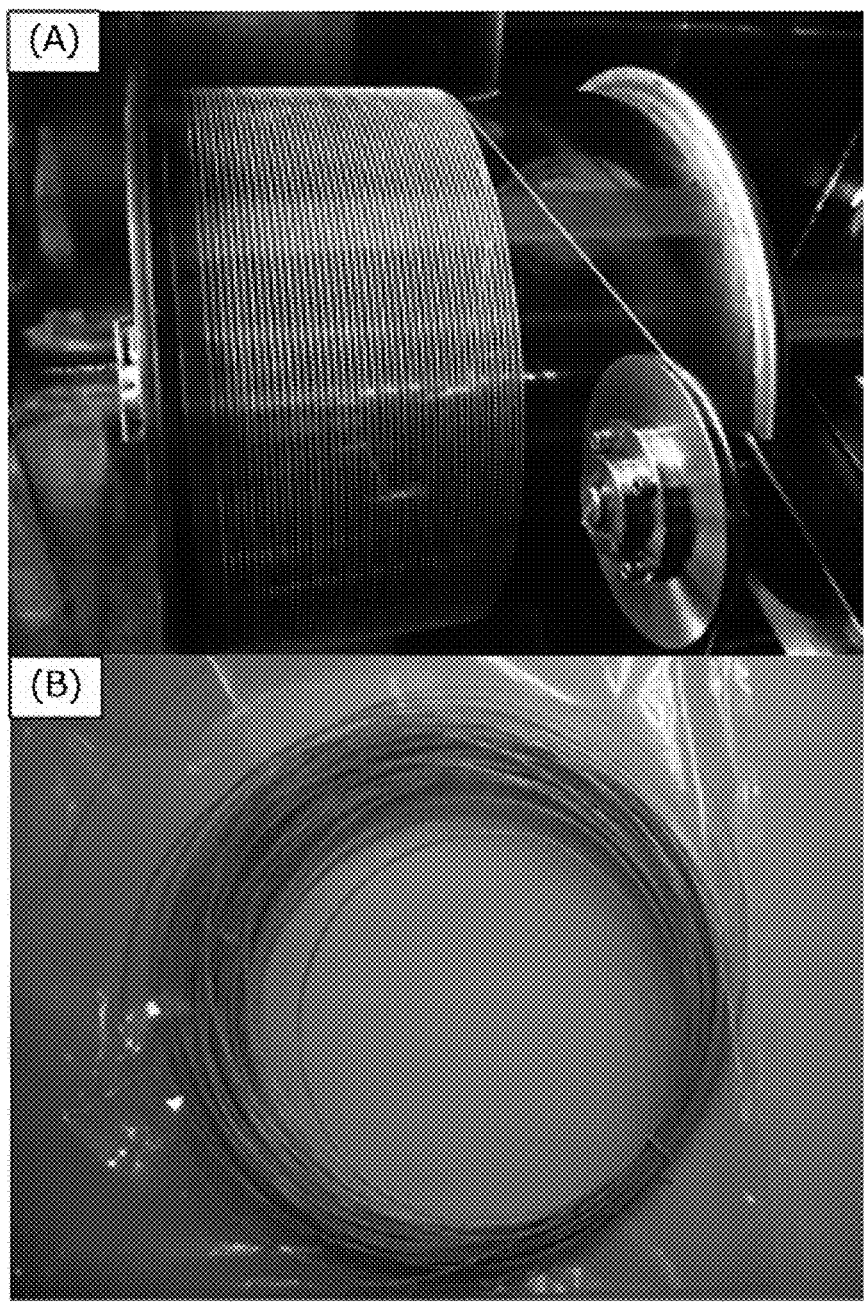
FIG. 7 is photographs showing the appearance of a copper-coated aluminum wire material of Example 2. Here.

FIG. 7 is photographs showing the appearance of the copper-coated aluminum wire material of Example 2.

FIG. 7(A) shows how the copper-coated aluminum wire material is wound up around the second drum 212, and FIG. 7(B) shows what the copper-coated aluminum wire material looks like after the wire drawing treatment was performed. Although in FIG. 7, the copper-coated aluminum wire material is represented by gray scale, the surface thereof in each of FIGS. 7(A) and 7(B) shows brightness of the copper.

Figure 8:
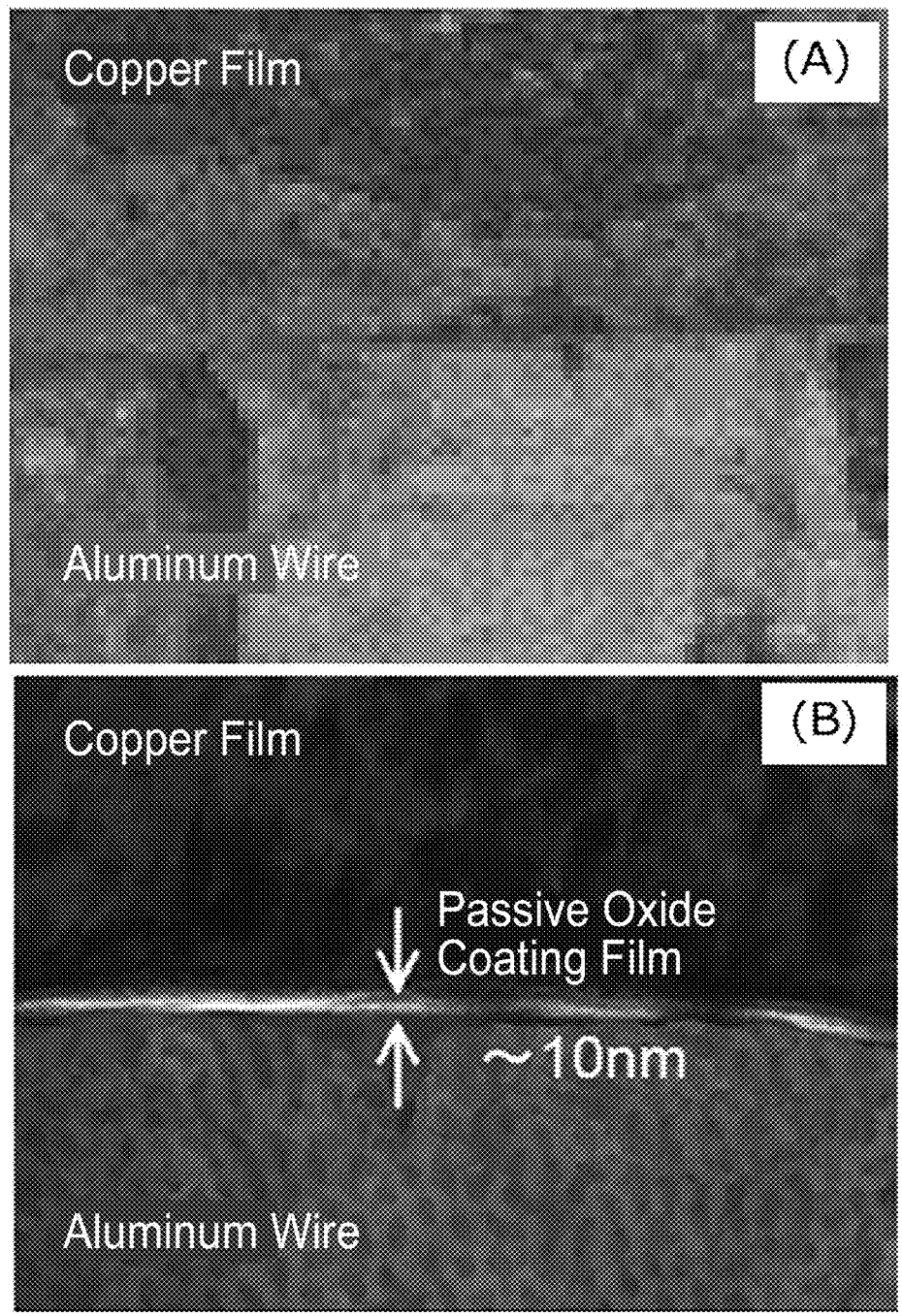
FIG. 8 is SEM images showing a section of copper-coated aluminum wire materials of Examples 2 and 5. Here.

FIG. 8 is SEM images showing a section of the copper-coated aluminum wire materials of Examples 2 and 5.

FIG. 8(A) is a sectional SEM image of the copper-coated aluminum wire material of Example 2, and FIG. 8(B) is a sectional SEM image of the copper-coated aluminum wire material of Example 5. According to FIG. 8(A), it has been confirmed that the interface between the aluminum wire material and the copper thin film includes no passive oxide coating film. On the other hand, according to FIG. 8(B), it has been observed that the interface between the aluminum wire material and the copper thin film includes a passive oxide coating film having a thickness of about 10 nm. Although the results of the copper-coated aluminum wire materials of Examples 1 to 4, 6 to 10, 12 to 14, and 16 to 24 are not shown in the figure, it has been confirmed that no Examples therein have a passive oxide coating film in the interface between the aluminum wire material and the copper thin film.

With further reference to the scratch test results of the copper-coated aluminum wire materials of Examples 2 and 5 in Table 2, it has been found that the copper-coated aluminum wire material of Example 2 has remarkably high adhesiveness compared with that of Example 5. It has been shown from these results that the method according to the present invention is a preferred method for coating an aluminum wire material with a copper thin film while removing a passive oxide coating film on the surface of the aluminum wire material and can provide high adhesiveness between the aluminum wire material and the copper thin film.

According to Examples 1 to 3, 6 to 10, 12 to 14, and 16 to 24 in Table 2, it has been shown that by performing the method according to the present invention, provided can be a copper-aluminum wire material having the following: the space factor of the copper thin film is in a range of 0.2% or more to 4% or less, preferably in a range of 0.3% or more to 0.55% or less; and the adhesiveness between the aluminum wire material and the copper thin film according to a scratch test conforming to JIS R 3255 is 10 mN or more, preferably in a range of 20 mN or more to 100 mN or less, more preferably in a range of 30 mN or more to 100 mN or less, further more preferably in a range of 50 mN or more to 100 mN or less.

Focusing on the results of the copper-coated aluminum wire materials of Examples 4, 8, and 13 in Table 2, it has been found that the copper-coated aluminum wire materials of the above Examples have adhesiveness but cause the breaking of wire during their production processes. It has been shown from these results that the aluminum wire material needs to be wound up at a speed of 1 m/min to less than 15 m/min.

Focusing on the results of the copper-coated aluminum wire materials of Examples 5, 11, and 15 in Table 2, it has shown that the application of a negative voltage more than 10 V to the first drum and the second drum at least is required to remove a passive oxide coating film and maintain adhesiveness.

Figure 9:
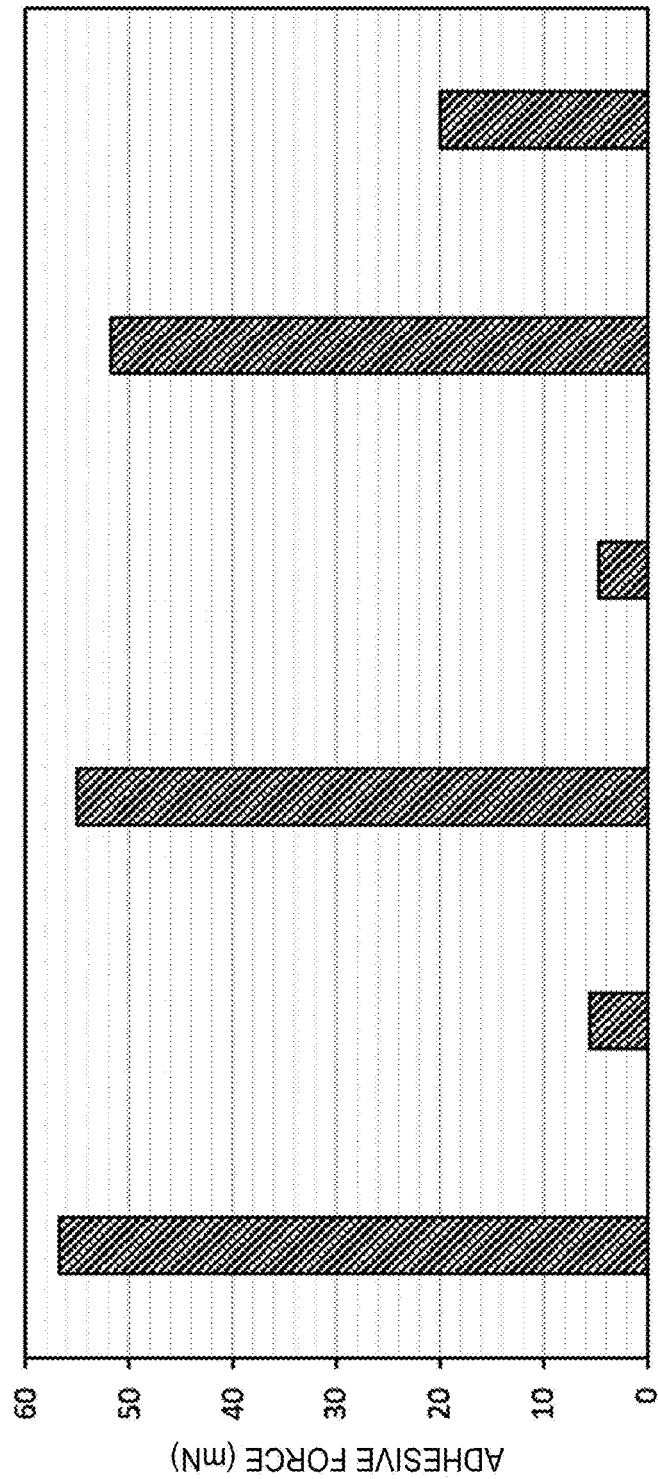
FIG. 9 is a graph showing scratch test results of copper-coated aluminum wire materials of Examples 2, 5, 10, 11, 12, and 14.

FIG. 9 is a graph showing the scratch test results of the copper-coated aluminum wire materials of Examples 2, 5, 10, 11, 12, and 14.

According to the results of adhesiveness in Table 2 and FIG. 9, it has been found that a negative voltage is preferably applied in a range of 200 V or more to 700 V or less and the aluminum wire is preferably wound up at a speed of 1 m/min to 5 m/min.

Figure 10:
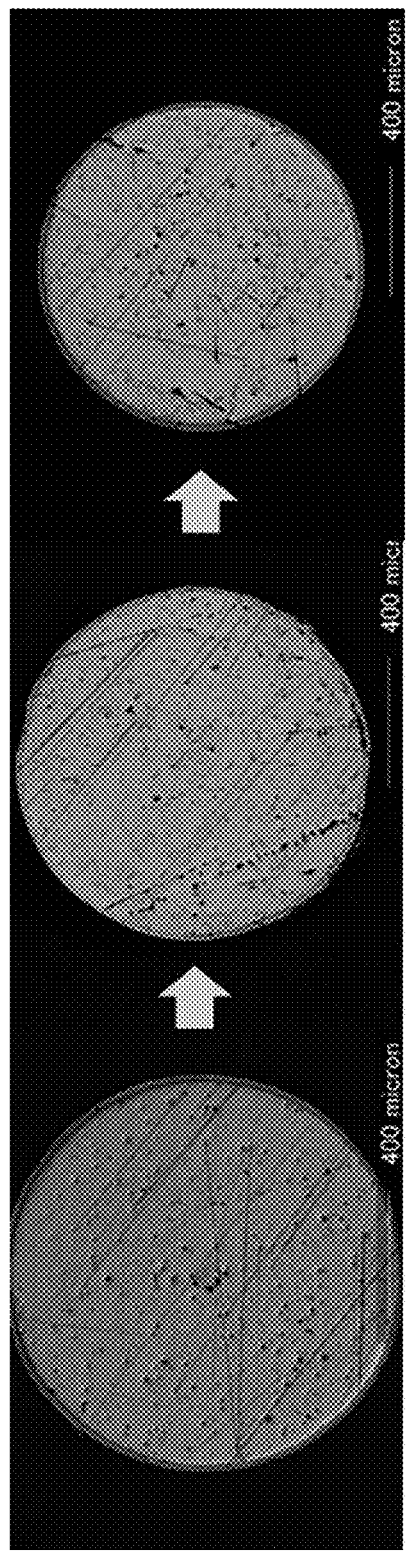
FIG. 10 shows an optical micrograph of a section of the copper-coated aluminum wire material of Example 2 during the wire drawing treatment thereof

FIG. 10 shows an optical micrograph of a section during the wire drawing treatment of the copper-coated aluminum wire material of Example 2.

FIG. 10 shows a change of the section in the drawing process of the copper-coated aluminum wire material of Example 2, and in the figure, the outer shape in order from the left to right is changed to 1.004 mm, 0.920 mm, and 0.837 mm. It has been confirmed that even when the drawing process by means of a die was performed two or more times, the copper thin film does not peel and maintains strong adhesion.

INDUSTRIAL APPLICABILITY

According to the present invention, provided can be a copper-coated aluminum wire material which has excellent adhesiveness and is made lighter in weight, and thus the copper-coated aluminum wire material is applicable as a wire material of an electronic device, a cable conductor, a braided wire, a coil for various motors, and the like.

REFERENCE SIGNS LIST

100 Copper-coated aluminum wire material
110 Aluminum wire material
120 Copper thin film
200 Ion plating device
201 Vacuum chamber
202 Electron gun
203 Thermionic filament
204 Ionization electrode
205 Gas supply tube
206 Hearth liner
207 Evaporation source
208 Electron beam
209 Shutter
210 Film thickness meter
211 First drum
212 Second drum
213 Return rolls
410 Vapor deposition area
510 Passive oxide coating film
520 Copper ions
530 Copper particles

The invention claimed is:

1. A copper-coated aluminum wire material comprising:
an aluminum wire material made of aluminum or an aluminum alloy; and
a copper thin film coating the aluminum wire material, wherein
a space factor of the copper thin film is in a range of 0.2% or more to 4% or less, and
an adhesiveness between the aluminum wire material and the copper thin film according to a scratch test conforming to JIS R 3255 satisfies 10 mN or more.

2. The copper-coated aluminum wire material according to claim 1, wherein the space factor of the copper thin film is in a range of 0.2% or more to less than 1% or less.

3. The copper-coated aluminum wire material according to claim 2, wherein the space factor of the copper thin film is in a range of 0.3% or more to 0.55% or less.

4. The copper-coated aluminum wire material according to claim 1, wherein the adhesiveness satisfies a range of 20 mN or more to 100 mN or less.

5. The copper-coated aluminum wire material according to claim 4, wherein the adhesiveness satisfies a range of 50 mN or more to 100 mN or less.

6. The copper-coated aluminum wire material according to claim 1, wherein the aluminum wire material is made of aluminum which has a purity in a range of 99.9% or more to 99.99999% or less by mass.

7. The copper-coated aluminum wire material according to claim 1, wherein the aluminum alloy is an alloy of aluminum (Al) with at least one element selected from the group consisting of magnesium (Mg), iron (Fe), zirconium (Zr), zinc (Zn), chromium (Cr), scandium (Sc), manganese (Mn), boron (B), titanium (Ti), copper (Cu), lithium (Li), and silicon (Si).

8. The copper-coated aluminum wire material according to claim 1, comprising no passive oxide coating film in an interface between the aluminum wire material and the copper thin film.

9. A method for producing copper-coated aluminum wire material of claim 1 by coating an aluminum wire material made of aluminum or an aluminum alloy with a copper thin film by means of an ion plating method, the method comprising the following steps of:
setting, in a vacuum chamber providing a copper evaporation source, an aluminum wire material having an outer diameter in a range of 0.1 mm or more to 1.5 mm or less and being wound around a first drum, wherein the aluminum wire material from the first drum can be wound up around a second drum by cross-rotating at least one pair of return rolls and a distance between the aluminum wire material straddling the at least one pair of return rolls and a center of the copper evaporation source is from 500 mm or more to 1000 mm or less;
evaporating copper from the copper evaporation source by electron-beam heating and ionizing the evaporated copper;
applying a negative voltage in a range of more than 10 V to 800 V or less to the first drum and the second drum; and
forming the copper thin film on the aluminum wire material by bringing copper ions formed by ionizing the evaporated copper into collision with the aluminum wire material which is, at a speed of 1 m/min or more to less than 15 m/min, wound up around the second drum from the first drum by cross-rotating the at least one pair of return rolls.

10. The method according to claim 9, wherein the step of applying a negative voltage includes applying a negative voltage in a range of 50 V or more to 700 V or less.

11. The method according to claim 10, wherein the step of applying a negative voltage includes applying a negative voltage in a range of 200 V or more to 700 V or less.

12. The method according to claim 9, wherein the step of forming a copper thin film includes winding the aluminum wire material at a speed of 1 m/min or more to 5 m/min or less.

13. The method according to claim 9, wherein the aluminum wire material is made of aluminum which has a purity in a range of 99.9% or more to 99.99999% or less by mass.

14. The method according to claim 9, wherein the aluminum alloy is an alloy of aluminum (Al) with at least one element selected from the group consisting of magnesium (Mg), iron (Fe), zirconium (Zr), zinc (Zn), chromium (Cr), scandium (Sc), manganese (Mn), boron (B), titanium (Ti), copper (Cu), lithium (Li), and silicon (Si).

15. The method according to claim 9, further comprising a step of washing a surface of the aluminum wire material by an ion bombardment treatment using an argon ion, prior to the step of evaporating copper from the copper evaporation source by electron-beam heating and ionizing the evaporated copper.

16. The method according to claim 15, wherein the ion bombardment treatment is performed at a pressure in the vacuum chamber in a range of 1 Pa or more to 10 Pa or less.

17. The method according to claim 9, further comprising a step of repeating the step of forming the copper thin film.

18. The method according to claim 9, further comprising a step of performing a wire drawing treatment of the copper-coated aluminum wire material produced by the step of forming the copper thin film.

19. The method according to claim 18, wherein the step of performing the wire drawing treatment is a drawing process by means of a carbide die or a diamond die.

20. The method according to claim 19, wherein the copper-coated aluminum wire material is annealed in a temperature range of 300° C. or more to 500° C. or less for a time of 1 second or more to 5 minutes or less before, after, or during the drawing process.

* * * * *